(12) United States Patent
Sell et al.

(10) Patent No.: US 7,732,285 B2
(45) Date of Patent: Jun. 8, 2010

(54) SEMICONDUCTOR DEVICE HAVING SELF-ALIGNED EPITAXIAL SOURCE AND DRAIN EXTENSIONS

(75) Inventors: Bernhard Sell, Portland, OR (US); Tahir Ghani, Portland, OR (US); Anand Murthy, Portland, OR (US); Harry Gomez, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 339 days.

(21) Appl. No.: 11/729,189

(22) Filed: Mar. 28, 2007

(65) Prior Publication Data

US 2008/0242037 A1    Oct. 2, 2008

(51) Int. Cl.
*H01L 21/336* (2006.01)
(52) U.S. Cl. .................................. 438/288; 438/142
(58) Field of Classification Search .............. 438/142, 438/288
See application file for complete search history.

(56) References Cited

U.S. PATENT DOCUMENTS 6,232,188 B1   5/2001   Murtaza et al.
6,747,314 B2   6/2004   Sundaresan et al.
7,115,974 B2   10/2006  Wu et al.
7,348,232 B2*  3/2008   Chidambaram et al. ..... 438/199
7,446,026 B2*  11/2008  Zhang et al. ................. 438/592

FOREIGN PATENT DOCUMENTS

WO    2008121659 A1    10/2008

OTHER PUBLICATIONS

"International Search Report for PCT Patent Application No. PCT/US2008/058325", mailed on Jul. 29, 2008, 10 pages.

* cited by examiner

*Primary Examiner*—Thanh V Pham
*Assistant Examiner*—Caleb Henry
(74) *Attorney, Agent, or Firm*—Rahul D. Engineer

(57) ABSTRACT

A method of forming a transistor with self-aligned source and drain extensions in close proximity to a gate dielectric layer of the transistor comprises forming a gate stack on a substrate, implanting a dopant into regions of the substrate adjacent to the gate stack, wherein the dopant increases the etch rate of the substrate and defines the location of the source and drain extensions, forming a pair of spacers on laterally opposite sides of the gate stack that are disposed atop the doped regions of the substrate, etching the doped regions of the substrate and portions of the substrate subjacent to the doped regions, wherein an etch rate of the doped regions is higher than an etch rate of the portions of the substrate subjacent to the doped regions, and depositing a silicon-based material in the etched portions of the substrate.

7 Claims, 8 Drawing Sheets

SEMICONDUCTOR DEVICE HAVING SELF-ALIGNED EPITAXIAL SOURCE AND DRAIN EXTENSIONS

BACKGROUND

Increased performance of circuit devices on a substrate (e.g., integrated circuit (IC) transistors, resistors, capacitors, etc. on a semiconductor substrate) is usually a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to increase movement of electrons in N-type MOS device (NMOS) channel regions and to increase movement of positive charged holes in P-type MOS device (PMOS) channel regions.

One method of reducing the overall resistance of a MOS device is to dope the area between the source/drain regions and the channel region, known as the tip regions of a MOS device. For instance, a dopant may be implanted in the source/drain regions and an anneal may be carried out to diffuse the dopant towards the channel region.

Because an implant and diffusion method is used, the ability to control the dopant concentration and location is limited. Furthermore, the size of other parts of a MOS device, such as the thickness of its offset spacers, can also have a great impact on the location of the tip regions. All of this, in turn, affects the ability of the tip regions to maximize dopant concentration and come into close proximity of the channel region. Accordingly, improved methods or structures are needed to overcome the limitations of conventional tip regions.

DETAILED DESCRIPTION

Described herein are systems and methods of forming epitaxial source and drain extensions in a MOS device. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

By way of background, a conventional metal oxide semiconductor (MOS) transistor includes source and drain "tip regions" that are designed to decrease the overall resistance of the transistor while improving short channel effects. These tip regions are portions of the substrate where a dopant such as boron or carbon is implanted using an implant and diffusion technique. The source tip region is formed in the area between the source region and the channel region. Likewise, the drain tip region is formed in the area between the drain region and the channel region. The tip regions minimally underdiffuse the gate dielectric layer of the transistor.

Figure 1A:
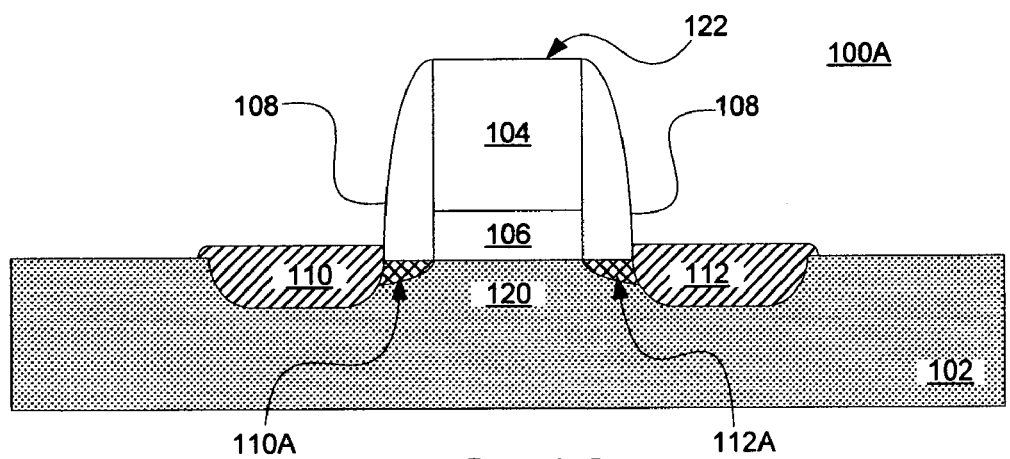
FIG. 1A illustrates a conventional MOS device that includes source and drain tip regions.

FIG. 1A illustrates a conventional MOS transistor 100A formed on a substrate 102. The source region 110 and the drain region 112 are typically formed by either implanting dopants such as boron into the substrate or by etching the substrate and then epitaxially depositing a silicon or silicon germanium material. A gate stack 122 is formed atop a channel region 120 of the transistor 100A. The gate stack 122 includes a gate dielectric layer 106 and a gate electrode 104. A pair of spacers 108 are formed adjacent to the gate stack 122.

As is known in the art, the spacers 108 generally create a distance of about 10 to 20 nanometers (nm) between the edges of the gate dielectric layer 106 and the edges of each of the source and drain regions 110/112. It is within this space that a source tip region 110A and a drain tip region 112A are formed. The tip regions 110A/112A overlap the spacers 108 and may overlap or underdiffuse the gate dielectric layer 106 by a distance of less than 10 nm.

The source tip region 110A and the drain tip region 112A are generally fabricated using implant and diffusion techniques. First, a dopant is implanted into the source region 110 and the drain region 112. Dopants that may be used include, but are not limited to, boron, arsenic, germanium, phosphorous, indium, or antimony. The dopant dosage may range from $1 \times 10^{14}$ to $1 \times 10^{16}$ atoms/cm$^3$. The transistor 100A is then annealed to cause the dopant to diffuse towards the channel region 120. Angled ion implantation techniques may also be used to further implant dopants into those areas between the gate dielectric layer 106 and the source/drain regions 110/112.

Unfortunately, as will be recognized by those of skill in the art, the shape of the tip regions 110A/112A, the distance the dopants penetrate below the spacers 108, and the concentration gradient of the tip regions 110A/112A are all dependent on the diffusion properties of the dopant in the substrate material. For instance, the concentration of the tip regions will be high proximate to the source/drain region 110/112 and low proximate to the channel region 120. Although highly desired, it is nearly impossible to make the dopant concentration proximate to the channel region 120 very high without driving the dopant into the channel region 120. Furthermore, the source and drain regions 110/112 cannot be moved closer to the channel region 120 because the dopant may again be driven into the channel region 120. This limits how close the source and drain regions 110/112 can be formed to the channel region 120, thereby constraining how far the gate length may be scaled down.

Figure 1B:
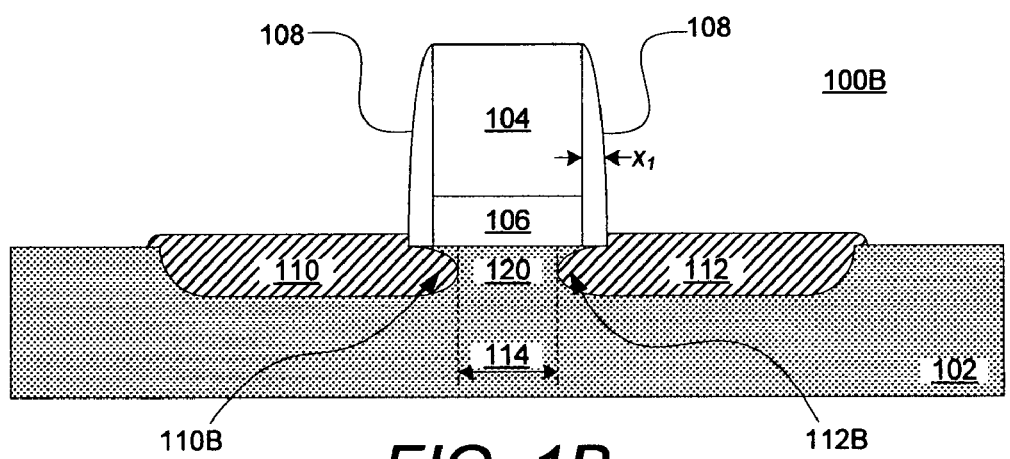
FIG. 1B illustrates a MOS device that includes source and drain epitaxial extensions.

FIG. 1B illustrates an improved MOS transistor 100B formed on a substrate 102 using source and drain "extensions". Rather than implanting and diffusing a dopant under the spacers 108 to form tip regions, the MOS transistor 100B uses an undercut etch to allow the source region 110 and the drain region 112 to extend below the spacers 108 and the gate dielectric layer 106. The portions of the source/drain regions 110/112 that extend below the spacers 108 are referred to herein as a source extension 110B and a drain extension 112B. The source and drain extensions 110B/112B replace the less desirable tip regions 110A/112A described in FIG. 1A.

The source/drain regions 110/112 and the source/drain extensions 110B/112B are formed by etching the substrate, which includes undercutting the spacers, and then epitaxially depositing a silicon or silicon germanium material. The source and drain extensions 110B/112B are therefore formed in the same process step as the source and drain regions 110/112, which reduces the overall number of process steps. The source and drain extensions 110B/112B also provide further advantages over the source/drain tip regions 110A/112A. For instance, unlike conventional tip regions, the lattice structure of the source/drain extensions 110B/112B induces a strain in the channel region 120 that increases electron mobility and therefore decreases resistance in the channel.

Another advantage is that the interface between the source/drain extensions 110B/112B and the substrate material 102 that forms the channel region 120 is abrupt. On one side of the interface is the epitaxially deposited doped silicon material and on the other side of the interface is the substrate material that makes up the channel region 120. This structure enables the epitaxial source/drain extensions 110B/112B to bring the heavily doped silicon material in very close proximity to the channel region 120. The dopants in the epitaxial source/drain extensions 110B/112B remain substantially or completely within the extensions and do not tend to diffuse into the channel region 120.

Figure 1C:
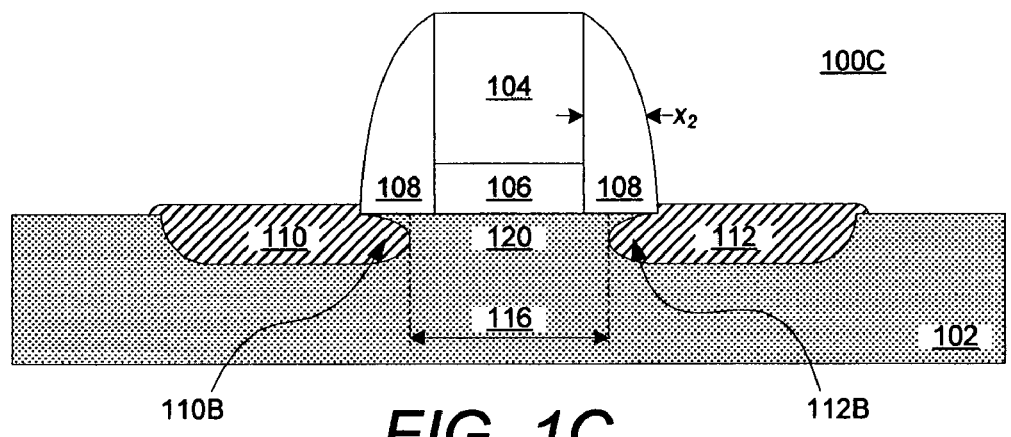
FIG. 1C illustrates how spacer thickness impacts the etching of epitaxial extensions of a MOS device.

Unfortunately, there are some disadvantages to conventional methods of forming source and drain extensions 110B/112B. One disadvantage is illustrated in FIGS. 1B and 1C. As shown, conventional undercut etching techniques result in the formation of a bulleted profile for the undercut region. In other words, more of the substrate material is etched a slight distance below the gate dielectric layer 106 than is etched directly adjacent to the gate dielectric layer 106. As such, the source extension 110B and the drain extension 112B each have a bulleted profile as well, which produces a less than optimal stain in the channel region 120. Furthermore, because there is much variance in conventional undercut etching techniques, there tends to be a lot of variance in the resulting source and drain extensions 110B/112B that are formed.

Another disadvantage to conventional methods of forming source and drain extensions 110B/112B concerns the effect that spacer thickness has on the undercut etch, as described in FIGS. 1B and 1C. Starting with FIG. 1B, the MOS transistor 100B is shown having offset spacers 108 of a first thickness $x_1$. A substrate etch has been performed that undercuts the spacers 108 and a portion of the gate dielectric layer 106 to enable the formation of source and drain extensions 110B/112B. An undercut-to-undercut (UC-to-UC) distance 114 separates source extension 110B from drain extension 112B.

Moving to FIG. 1C, a MOS transistor 100C is shown with offset spacers 108 having a thickness $x_2$. Here, the thickness $x_2$ is much greater than the thickness $x_1$ of the spacers 108 in FIG. 1B. As a result, when the substrate etch is performed, the thicker spacers 108 push out the undercut etch and cause the source/drain extensions 110B/112B to be formed further away from the channel region 120 of the transistor 100C. The substrate etch therefore undercuts less of the surface area beneath the MOS transistor 100C. Accordingly, a UC-to-UC distance 116 for the MOS transistor 100C is much larger than the UC-to-UC distance 114 for the MOS transistor 100B. Unfortunately, altering the UC-to-UC distance in this manner yields large drive current variations for the MOS transistors.

Figure 1D:
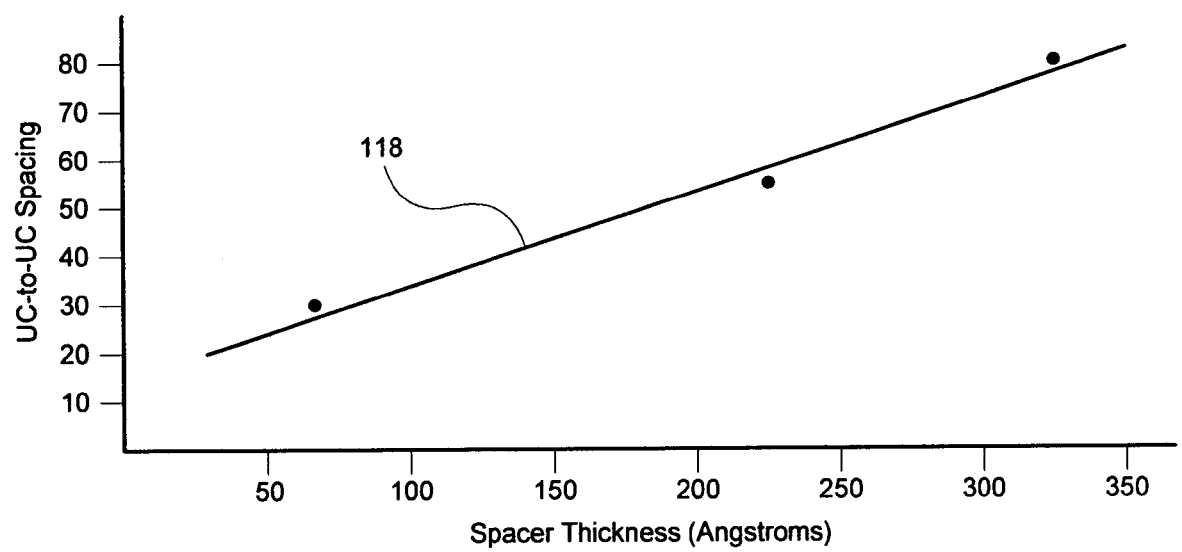
FIG. 1D is a graph illustrating the dependence of UC-to-UC distance on spacer thickness.

FIG. 1D is a graph illustrating how spacer thickness affects the UC-to-UC distance in devices formed using known methods. The graph provides data, represented by line 118, showing that as spacer thickness increases, the UC-to-UC distance also increases, leading to large drive current variations. Typically, for every nanometer (nm) of spacer thickness increase, the UC-to-UC distance increases by around 2 nm. As such, forming source/drain extensions using conventional methods permits the thickness of the offset spacer to have a tremendous impact on the performance of the MOS device.

To address these issues described above, implementations of the invention provide methods of forming novel, self-aligned and epitaxially deposited source and drain extensions. The epitaxial source and drain extensions of the invention place highly doped silicon material in close proximity to the channel region of a MOS transistor. And because the source and drain extensions are self-aligned, they are substantially less impacted by offset spacer thickness relative to conventional processes.

Figure 2:
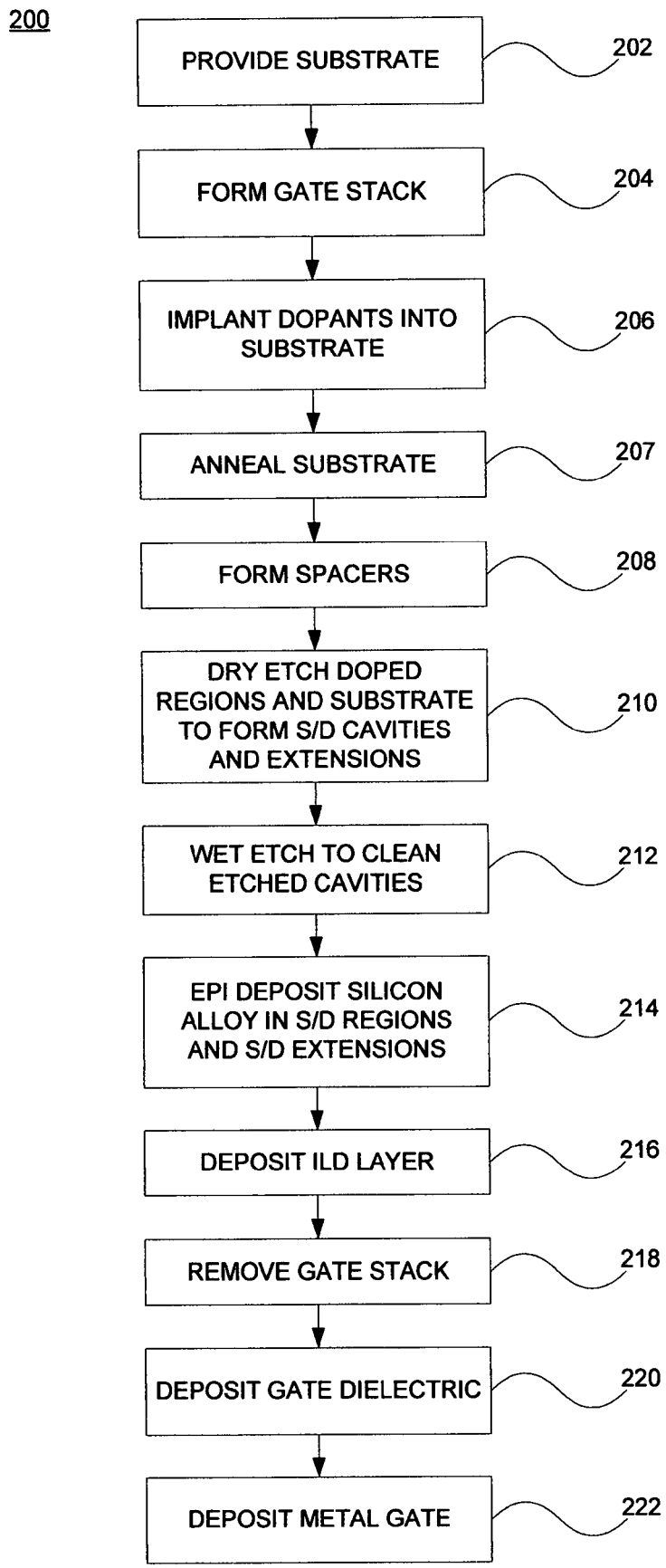
FIG. 2 is a method of forming source and drain epitaxial extensions in accordance with an implementation of the invention.

FIG. 2 is a method 200 of building a MOS transistor with self-aligned epitaxial source and drain extensions. FIGS. 3A through 3E illustrate structures that are formed when the method 200 of FIG. 2 is carried out.

The method 200 begins with a semiconductor substrate upon which a MOS device, such as a MOS transistor, may be formed (process 202 of FIG. 2). The semiconductor substrate may be formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, or gallium antimonide. Although a few examples of materials from which the substrate may be formed are described here, any material that may serve as a foundation upon which a semiconductor device may be built falls within the spirit and scope of the present invention.

A gate stack is formed on the semiconductor substrate (204). In some implementations of the invention, the gate stack may be formed by depositing and then patterning a gate dielectric layer and a gate electrode layer. For instance, in one implementation, a gate dielectric layer may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric layer may be thermally grown. Next, a gate electrode material may be deposited on the gate dielectric layer using similar deposition techniques such as ALD, CVD, or PVD. In some implementations, the gate electrode material is polysilicon or a metal layer. In some implementations, the gate electrode material is a sacrificial material that can later be removed for a replacement metal gate process. A conventional patterning process may then be carried out to etch away portions of the gate electrode layer and the gate dielectric layer to form the gate stack.

The gate dielectric material may be formed from materials such as silicon dioxide or high-k dielectric materials.

Examples of high-k gate dielectric materials that may be used include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, the high-k gate dielectric layer may be between around 5 Angstroms (Å) to around 50 Å thick. In further embodiments, additional processing may be performed on the high-k gate dielectric layer, such as an annealing process to improve the quality of the high-k material.

Figure 3A:
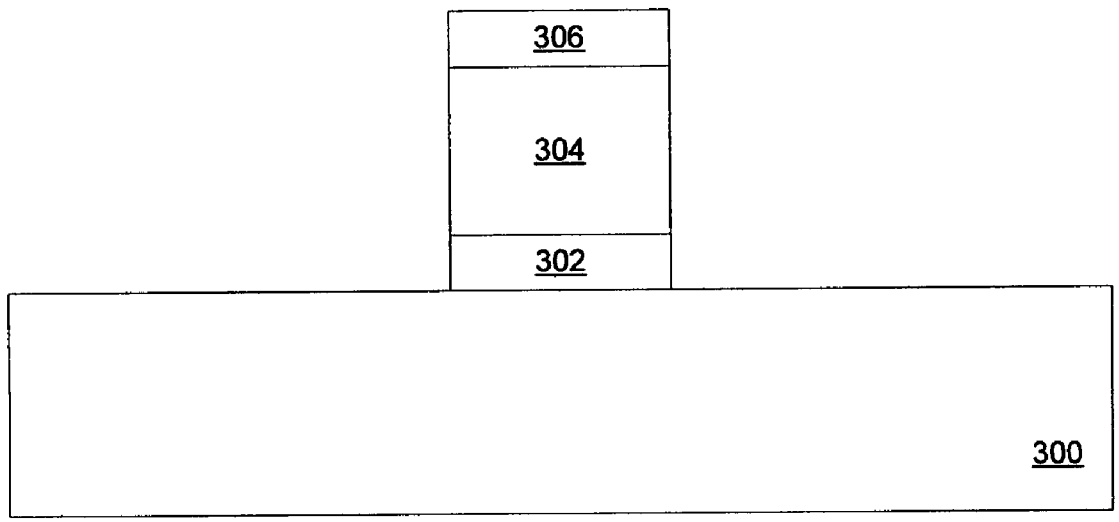
FIGS. 3A to 3I illustrate structures that are formed when carrying out the method of FIG. 2.

FIG. 3A illustrates a substrate 300 upon which a gate stack is formed. In the implementation described here, the gate stack may include a high-k gate dielectric layer 302 and a sacrificial gate electrode 304. In other implementations, the gate stack may include a silicon dioxide gate dielectric layer and a polysilicon gate electrode. The gate stack may also include a gate hard mask layer 306 that provides certain benefits or uses during processing, such as protecting the gate electrode 304 from subsequent ion implantation processes. In implementations of the invention, this hard mask layer 306 may be formed using materials conventionally used as hard masks, such as such as a conventional dielectric materials.

After the gate stack is formed, an ion implantation process is carried out to highly dope portions of the substrate adjacent to the gate stack (206). In accordance with implementations of the invention, the dopant used in the ion implantation process is chosen based on its ability to increase the etch rate of the substrate material in which it is implanted. The specific dopant selected for the ion implantation process may vary based on the substrate material and the etchant used in a subsequent etching process. Since most substrates contain a large silicon, germanium, or indium antimonide component, dopants that increase the etch rate of silicon, germanium, or indium antimonide will often be chosen.

In implementations of the invention, specific dopants that may be selected to increase the etch rate of the substrate include, but are not limited to, carbon, phosphorous, and arsenic. For instance, carbon may be used at a dosage that ranges from $1\times10^{14}$ to $1\times10^{16}$ atoms/cm$^3$ using an implantation energy that falls between 5 and 15 kilo-electron volts (keV). Phosphorous may be used at a dosage that ranges from $1\times10^{14}$ to $5\times10^{15}$ atoms/cm$^3$ using an implantation energy that falls between 1 and 5 keV. Arsenic may be used at a dosage that ranges from $1\times10^{14}$ to $5\times10^{15}$ atoms/cm$^3$ using an implantation energy that falls between 2 and 5 keV.

In an implementation of the invention, the ion implantation substantially occurs in a vertical direction (i.e., a direction perpendicular to substrate). In some implementations, at least a portion of the ion implantation process may occur in an angled direction to implant ions below the gate stack. As mentioned above, if the gate electrode contains metal, a dielectric hard mask may be formed on the gate stack to prevent doping of the metal gate electrode.

Next, an anneal is carried out to drive the dopants further into the substrate and to reduce any damage sustained by the substrate during the ion implantation process (207). The implant and subsequent anneal may drive the ions to a substrate depth that falls between 2 nm and 20 nm. The anneal may be at a temperature that falls between 700° C. and 1100° C. for a time duration of up to one minute, for instance, a time duration of five seconds.

Figure 3B:
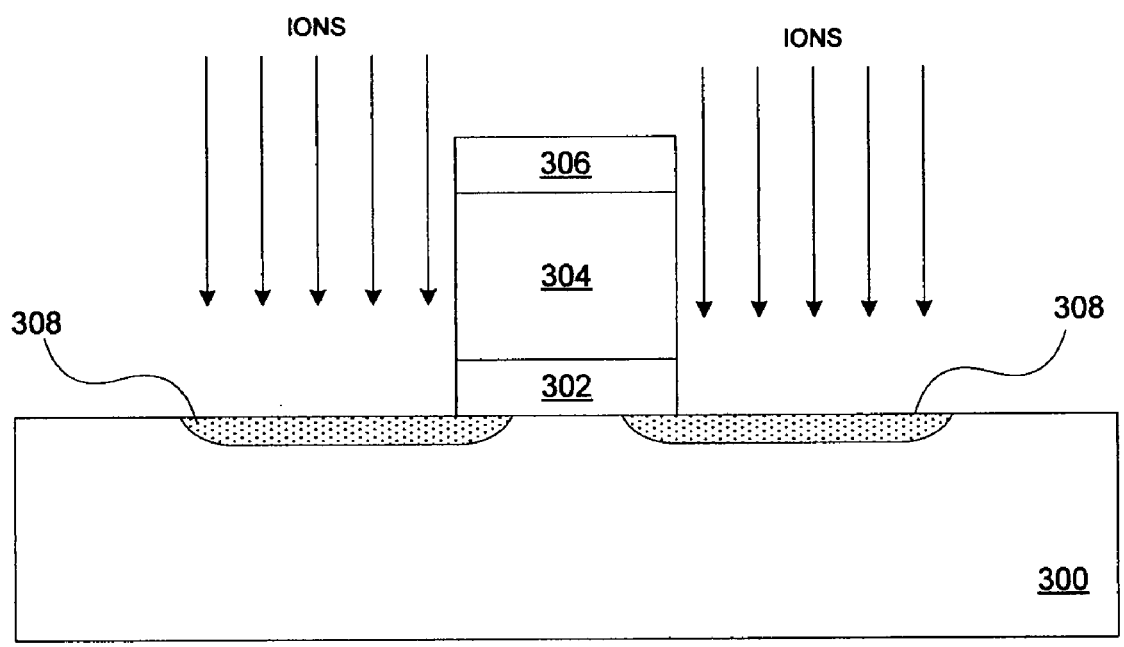

FIG. 3B illustrates the substrate 300 after the ion implantation and diffusion process. As shown, the ion implantation process creates two doped regions 308 adjacent to the gate dielectric layer 302. When exposed to an appropriate etchant, the doped regions 308 will have an etch rate that is higher than the etch rate of the surrounding substrate material. One of the doped regions 308 will serve as a portion of a source region, including a self-aligned epitaxial source extension, for the MOS transistor being formed. The other doped region 308 will serve as a portion of a drain region, including a self-aligned epitaxial drain extension, for the MOS transistor. In the implementation shown, portions of the doped regions 308 are sited below the gate dielectric layer 302. In the various implementations of the invention, the size of the doped regions 308, including their depth, may vary based on the requirements of the MOS transistor being formed.

Figure 3C:
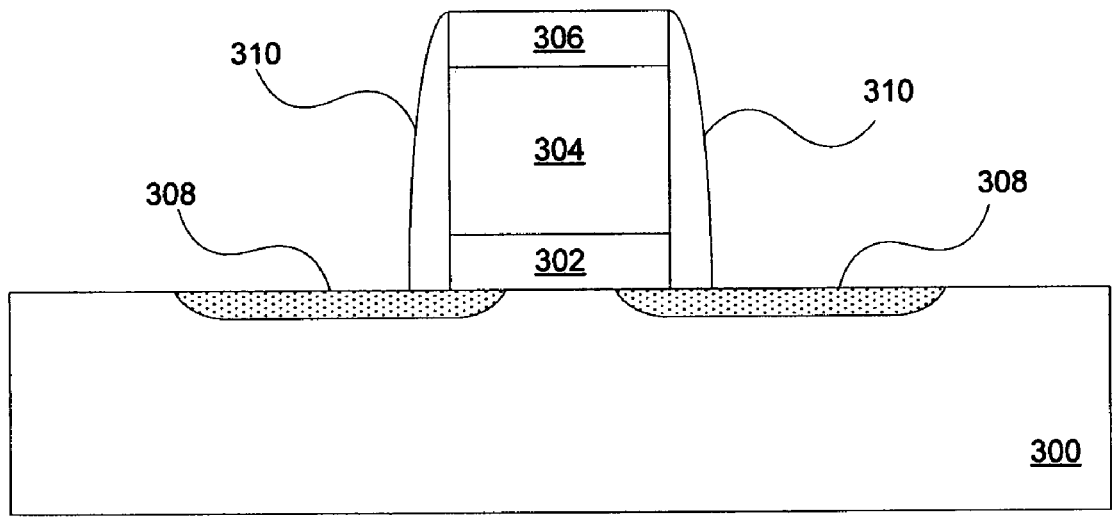

Next, spacers are formed on either side of the gate stack (208). The spacers may be formed using conventional materials, including but not limited to silicon oxide or silicon nitride. The width of the spacers may be chosen based on design requirements for the MOS transistor being formed. In accordance with implementations of the invention, the width of the spacers is not subject to design constraints imposed by the formation of the epitaxial source and drain extensions. FIG. 3C illustrates the substrate 300 with spacers 310 formed on either side of the gate electrode layer 304 and the gate dielectric layer 302.

After the spacers are formed on the substrate, a dry etch process may be carried out to etch the doped regions and to etch portions of the substrate to form cavities in which source/drain regions and source/drain extensions may be formed (210). The etched cavities are adjacent to the gate stack. The etched cavities may be formed to a depth that falls between 50 nm and 1500 nm, which is deeper than the doped regions. The etching process will therefore remove substrate material subjacent to the doped regions.

The dry etch process uses an etchant recipe that complements the dopant used in the ion implantation process to increase the etch rate of the doped regions. This enables the etching process to remove the doped regions at a faster rate than the remainder of the substrate. As such, with an appropriate increase in etch rate, the etching process can remove substantially all of the material from the doped regions by the time the etching of the cavities is complete. This includes portions of the doped regions that undercut the spacers and the gate dielectric layer, thereby defining the self-aligned extension architecture of the transistor. Increasing the etch rate of the doped regions enables the etched source and drain extension cavities to undercut the spacers and the gate dielectric layer without the UC-to-UC distance being substantially impacted by factors such as the thickness of the spacers, variations in the dry etch process, and other process variations.

In accordance with implementations of the invention, the dry etch process may use a chlorinated chemistry that takes place in a plasma reactor. In one implementation, the etchant recipe may consist of a combination of $NF_3$ and $Cl_2$ with argon or helium used as a buffer or carrier gas. The flow rate for the active etchant species may vary between 50 and 200 standard cubic centimeters per minute (SCCM) while the flow rate of the carrier gas may vary between 150 and 400 SCCM. A high energy plasma may be employed at a power that ranges from 700 W to 1100 W with a low RF bias of less than 100 W. The reactor pressure may range from around 1 pascal (Pa) to around 2 Pa.

In another implementation, the etchant chemistry may consist of a combination of HBr and $Cl_2$. The flow rate for etchant species may vary between 40 SCCM and 100 SCCM. A high energy plasma may be employed at a power that ranges from around 600 W to around 1000 W with a low RF bias of less than 100 W. The reactor pressure may range from around 0.3 Pa to around 0.8 Pa. In another implementation, the etchant chemistry may consist of a combination of $SF_6$ and $Cl_2$. The $SF_6$ flow rate may vary between 3 SCCM and 10 SCCM and the $Cl_2$ flow rate may vary between 20 SCCM and 60 SCCM. A high energy plasma may be employed at a power that ranges from around 400 W to around 900 W with no RF bias or an RF bias of less than 50 W. In this implementation, the $SF_6$ flow rate and the reactor pressure may be kept low to reduce the rate of removal and to maximize control. For instance, the reactor pressure may range from around 0.1 Pa to around 0.5 Pa. In yet another implementation, the etchant chemistry may consist of a combination of Ar and $Cl_2$. Here, the flow rate for the etchant species may vary between 40 SCCM and 80 SCCM. A medium energy plasma may be employed at a power that ranges from around 400 W to around 800 W with a high RF bias of between around 100 W and 200 W. The reactor pressure may range from around 1 Pa to around 2 Pa.

Figure 3D:
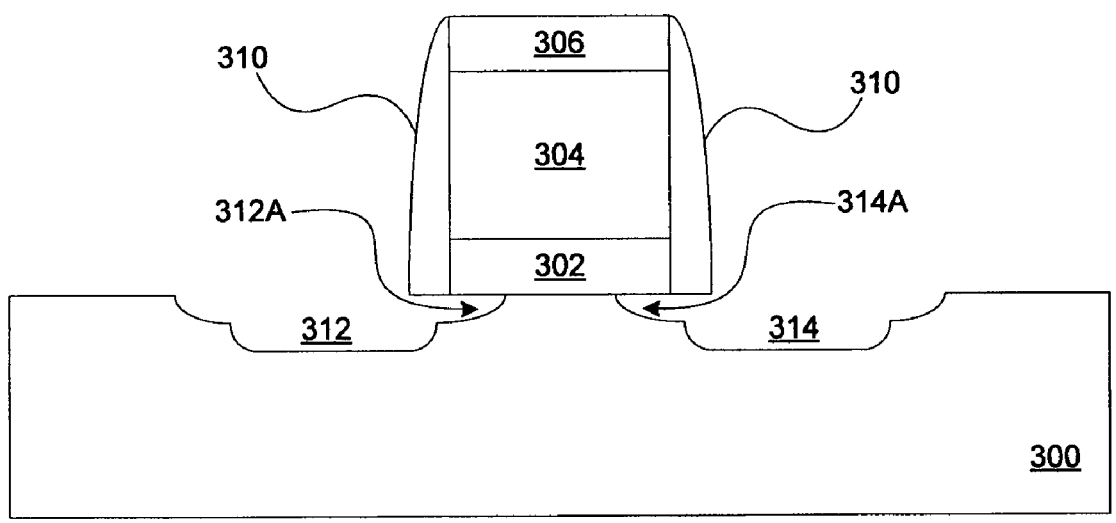

FIG. 3D illustrates the substrate 300 after the dry etch process has been carried out. As shown, a source region cavity 312 and a drain region cavity 314 are formed. Furthermore, a source extension cavity 312A and a drain extension cavity 314A have been formed by the etching of the doped regions 308. The thickness of the spacer 310 has minimal impact on the etching of the source extension cavity 312A and the drain extension cavity 314A due to the use of dopants and etchant recipes that increase the etch rate of the doped regions 308.

After the dry etch process has completed, a wet etch process may be applied to clean and further etch the source region cavity 312, the source extension cavity 312A, the drain region cavity 314, and the drain extension cavity 314A (212). Conventional wet etch chemistries known in the art for cleaning silicon and oxide material may be used. For instance, wet etch chemistries capable of removing silicon along its crystallographic planes may be used.

Figure 3E:
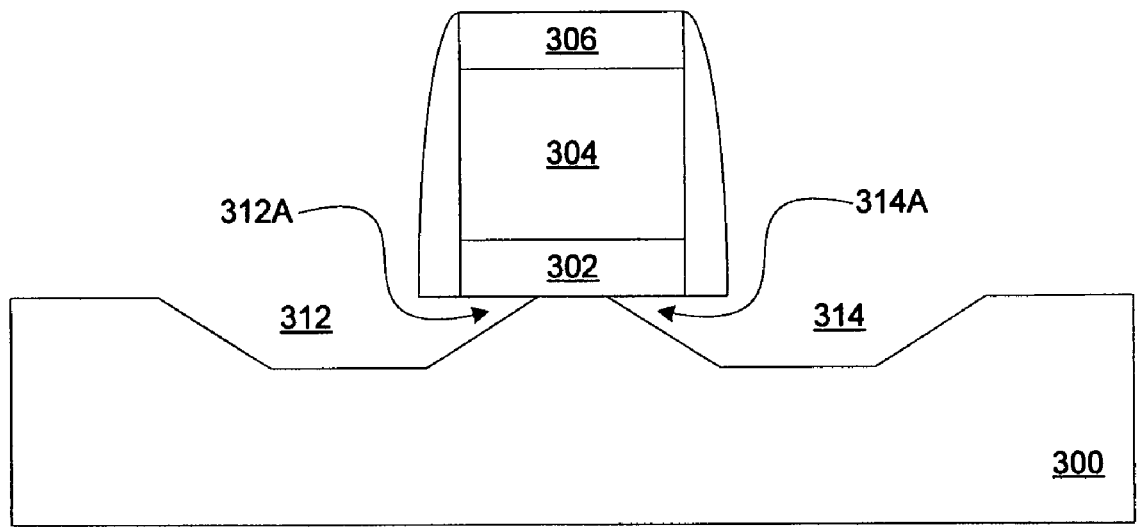

The wet etch serves at least two objectives. First, the wet etch removes contaminants such as carbon, fluorine, chlorofluorocarbons, and oxides such as silicon oxide to provide a clean surface upon which subsequent processes may be carried out. Second, the wet etch removes a thin portion of the substrate along the <111> and <001> crystallographic planes to provide a smooth surface upon which a high quality epitaxial deposition may occur. The thin portion of the substrate that is etched away may be up to 5 nm thick and may also remove residual contaminants. As shown in FIG. 3E, the wet etch causes edges of the source region cavity 312, the source extension 312A, the drain region cavity 314, and the drain extension 314A to follow the <111> and <001> crystallographic planes. It should also be noted that the source and drain extensions 312A and 314A do not have the bulleted profile that occurs in conventional processing.

The remainder of the process for forming the MOS transistor is similar to conventional MOS processing techniques. For example, after the etching process, the source and drain region cavities, including the source and drain extensions, may be filled with a silicon alloy using a selective epitaxial deposition process (214). This epitaxial deposition therefore forms the source and drain regions and the source and drain extensions in one process. In some implementations, the silicon alloy may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In some implementations, a CVD process may be used for the deposition.

In implementations, the silicon alloy material that is deposited in the source and drain region cavities has a lattice spacing that is different than the lattice spacing of the substrate material. The difference in lattice spacing induces a tensile or compressive stress in the channel region of the MOS transistor that is accentuated by depositing the silicon alloy in the source and drain extensions. As is known to those of skill in the art, deciding whether to induce a tensile stress or a compressive stress will depend on whether an NMOS or a PMOS transistor is being formed.

In accordance with implementations of the invention, for an NMOS transistor, the source and drain region cavities may be filled with carbon doped silicon. The carbon doped silicon may be epitaxially and selectively deposited. In further implementations, the carbon doped silicon may be further doped in situ with phosphorous. The carbon concentration may range from 0.5 atomic % to 3.0 atomic %. The phosphorous concentration may range from $5\times10^{19}/cm^3$ to $5\times10^{20}/cm^3$. The thickness of the carbon doped silicon may range from 400 Å to 1200 Å. The carbon and phosphorous doped silicon may be denoted as $(C,P)_y Si_{(1-y)}$.

The deposition of the highly doped $(C,P)_y Si_{(1-y)}$ source and drain regions may be carried out in a low pressure chemical vapor deposition (LPCVD) reactor using up to 60 cycles of a deposition and etch sequence based on silane ($SiH_4$), $PH_3$, $CH_3SiH_3$, and chlorine ($Cl_2$) chemistries. The reactor temperature may fall between 500° C. and 625° C. and the reactor pressure may be below 20 Pa. To achieve selectivity, epitaxy, and high dopant concentrations, the process parameters described in the following paragraphs may be used.

For the deposition phase, the co-reactants may include $SiH_4$ at a flow rate between 100 and 400 standard cubic centimeters per minute (SCCM), $CH_3SiH_3$ at a flow rate between 25 and 150 SCCM, $PH_3$ at a flow rate between 1 and 25 SCCM, and $H_2$ at a flow rate between 500 and 4000 SCCM. Each cycle of the deposition phase may last up to 4 minutes.

The deposition phase may be followed by a first purge phase. The first purge may include nitrogen at a flow rate between 500 SCCM and 2 standard liters per minute (SLM) and $N_2Cl_2$ at a flow rate between 5 and 50 SCCM. Each cycle of the first purge phase may last up to 10 seconds.

An etch phase may follow the purge phase. For the etch phase, the co-reactants may include $Cl_2$ at a flow rate between 5 and 25 SCCM. Each cycle of the etch phase may last up to 30 seconds.

The etch phase may be followed by a second purge phase. This second purge may include nitrogen at a flow rate between 50 SCCM and 2 SLM and $N_2Cl_2$ at a flow rate between 5 and 35 SCCM. Each cycle of the second purge phase may last up to 10 seconds.

The second purge phase may be followed by a third purge phase. The third purge may include hydrogen ($H_2$) at a flow rate between 5 and 25 SLM. Each cycle of the third purge phase may last up to 2 minutes.

In accordance with implementations of the invention, for a PMOS transistor, the source and drain region cavities may be filled with silicon germanium. The silicon germanium may be epitaxially deposited. The germanium concentration may range from 10 atomic % to 50 atomic %. In further implementations, the silicon germanium may be further doped in situ with boron. The boron concentration may range from $2\times10^{19}/cm^3$ to $7\times10^{20}/cm^3$. The thickness of the silicon germanium may range from 40 Å to 1500 Å.

Deposition of the doped silicon germanium may be carried out in a CVD reactor, an LPCVD reactor, or an ultra high vacuum CVD (UHVCVD). The reactor temperature may fall between 600° C. and 800° C. and the reactor pressure may fall between 1 and 760 Torr. The carrier gas may consist of hydrogen or helium at a flow rate that ranges between 10 and 50 SLM.

The deposition may be carried out using a silicon source precursor gas such as dichlorosilane (DCS or $SiH_2Cl_2$), silane ($SiH_4$), or disilane ($Si_2H_6$). For instance, DCS may be used at a flow rate that ranges between 15 and 100 SCCM. The deposition may also use a germanium source precursor gas such as $GeH_4$ that is diluted in $H_2$ (e.g., the $GeH_4$ may be diluted at 1-5%). For instance, the diluted $GeH_4$ may be used at a 1% concentration and at a flow rate that ranges between 50 and 300 SCCM. For an in situ doping of boron, diluted $B_2H_6$ may be used (e.g., the $B_2H_6$ may be diluted in $H_2$ at 1-5%). For instance, the diluted $B_2H_6$ may be used at a 3% concentration and at a flow rate that ranges between 10 and 100 SCCM. In some implementations, an etching agent may be added to increase the selectivity of the deposition. For instance, HCl or $Cl_2$ may be added at a flow rate that ranges between 50 and 300 SCCM.

Figure 3F:
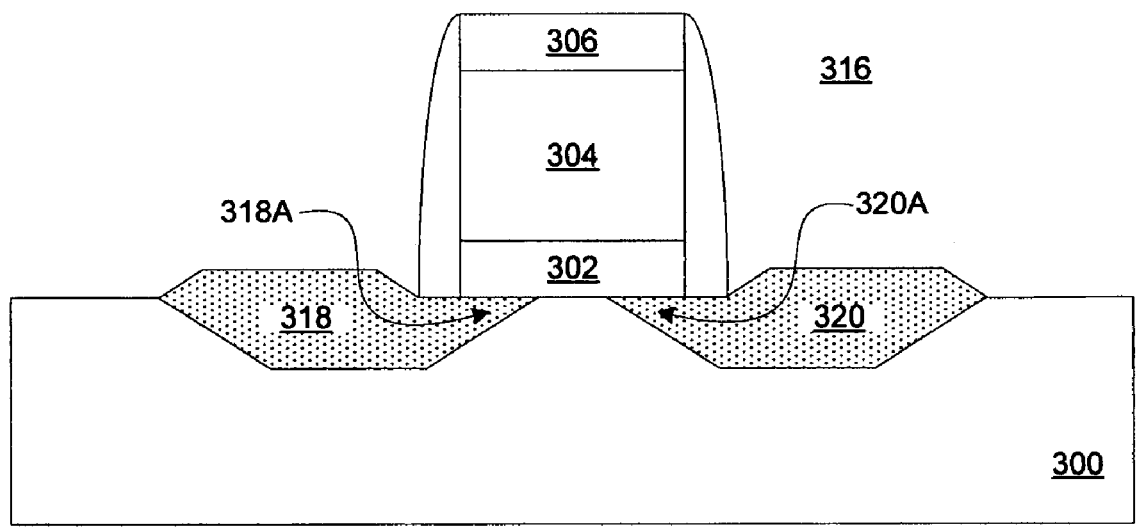

FIG. 3F illustrates a MOS transistor 316 in which the source cavity 312 has been filled with a silicon alloy to form a source region 318 and the drain cavity 314 has been filled with a silicon alloy to form a drain region 320. The extensions have been filled as well to form an epitaxial source extension 318A and an epitaxial drain extension 320A. As shown in FIG. 3F, unlike conventional source and drain tip regions that are formed through implant and diffusion techniques and therefore have no clear boundary between the tip regions and the channel region, the self-aligned, epitaxial source and drain extensions of the invention have an abrupt boundary. In other words, the interface between the epitaxial source/drain extensions and the channel region is clear and well-defined. On one side of the interface is the epitaxially deposited doped silicon material and on the other side of the interface is the substrate material that makes up the channel region. The dopants in the epitaxial source/drain extensions remain substantially or completely within the extensions and do not tend to diffuse into the channel region, thereby enabling the epitaxial source and drain extensions to bring the heavily doped silicon material in very close proximity to the channel region relative to conventional techniques (i.e., the source/drain extensions 318A/320A may undercut the gate dielectric layer 302 by more than 10 nm). As will be appreciated by those of skill in the art, this in turn enables the gate length to be scaled down without having to shorten the channel region.

Forming the epitaxial source and drain extensions in relatively close proximity to the channel region also imparts a larger hydrostatic stress on the channel. This stress increases the strain within the channel, thereby increasing mobility in the channel and increasing drive current. This stress can be further amplified by increasing the doping of the epitaxial source and drain extensions, which is easily controlled during the epitaxial deposition of the silicon alloy. This is an improvement over conventional diffusion processes where the tip regions generally do not induce a strain on the channel region.

Figure 3G:
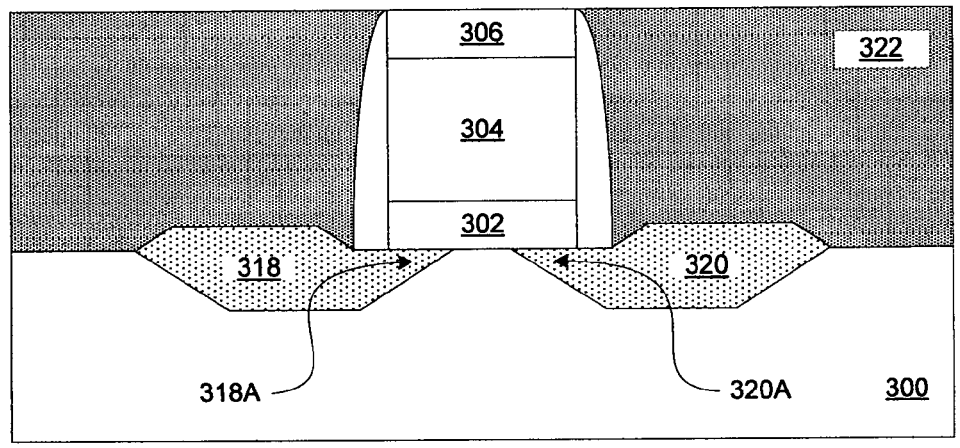

As will be appreciated by those of skill in the art, the MOS transistor 316 may undergo further MOS processing, such as replacement gate oxide processes, replacement metal gate processes, annealing, or salicidation processes, that may further modify the transistor 316 and/or provide the necessary electrical interconnections. For instance, after the epitaxial deposition of the source/drain regions and the source/drain extension, an interlayer dielectric (ILD) may be deposited and planarized over the transistor 316 (216). The ILD may be formed using materials known for the applicability in dielectric layers for integrated circuit structures, such as low-k dielectric materials. Such dielectric materials include, but are not limited to, oxides such as silicon dioxide ($SiO_2$) and carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The dielectric layer may include pores or other voids to further reduce its dielectric constant. FIG. 3G illustrates an ILD layer 322 that has been deposited over the MOS transistor 316.

Figure 3H:
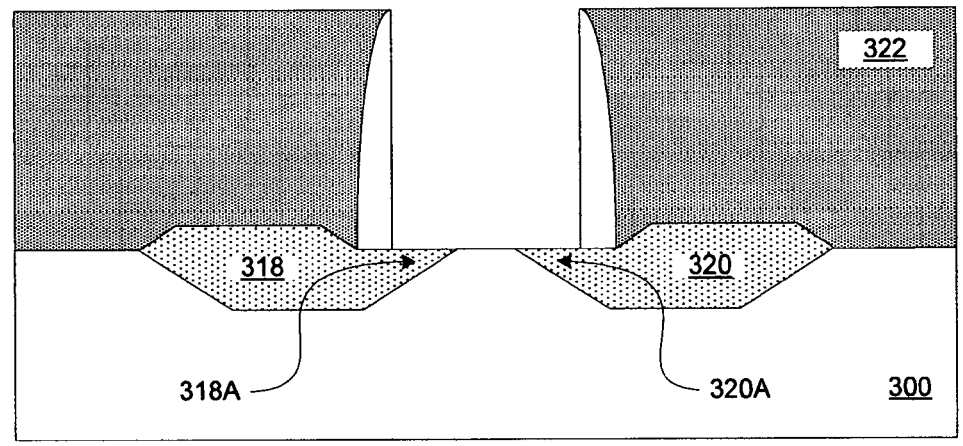

Next, in implementations of the invention in which a replacement metal gate process is used, the gate stack (i.e., the high-k gate dielectric layer 302, the sacrificial gate electrode 304, and the hard mask layer 306) may be removed using an etching process (218). Methods for removing these layers are well known in the art. In alternate implementations, only the sacrificial gate 304 is removed. FIG. 3H illustrates the trench opening that is formed when the gate stack is etched away.

Figure 3I:
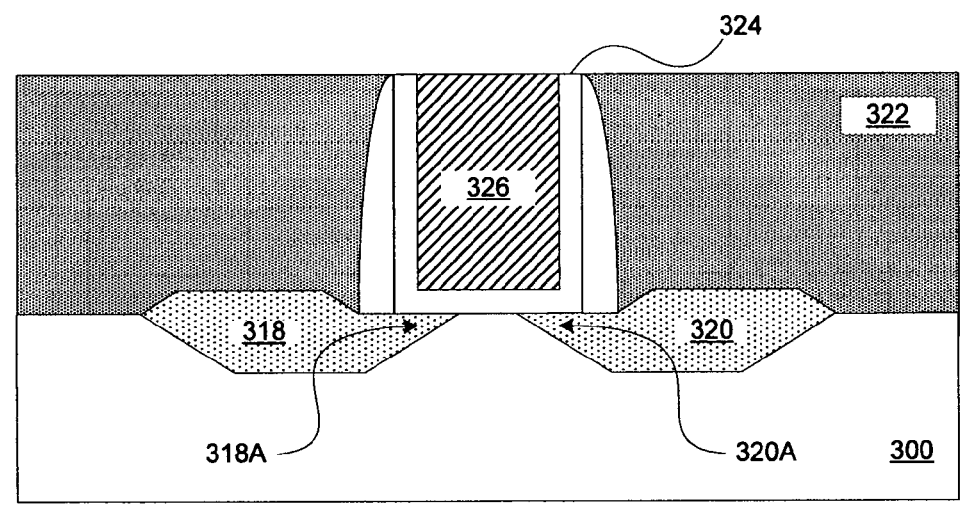

If the gate dielectric layer is removed, a new gate dielectric layer may be deposited into the trench opening (220). The high-k dielectric materials described above may be used here, such as hafnium oxide. The same deposition processes may also be used. Replacement of the gate dielectric layer may be used to address any damage that may have occurred to the original gate dielectric layer during application of the dry and wet etch processes. A metal gate electrode layer may then be deposited over the gate dielectric layer (222). Conventional metal deposition processes may be used to form the metal gate electrode layer, such as CVD, ALD, PVD, electroless plating, or electroplating. FIG. 3I illustrates a high-k gate dielectric layer 324 and a metal gate electrode 326 that have been deposited into the trench opening.

The metal gate electrode layer may consist of a P-type workfunction metal or an N-type workfunction metal, depending on whether the transistor is to be a PMOS or an NMOS transistor. In some implementations, a PMOS transistor is being formed and materials that may be used to form a P-type workfunction metal layer include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. Alternately, in some implementations an NMOS transistor is being formed and materials that may be used to form an N-type workfunction metal layer include, but are not limited to, hafnium, zirconium, titanium, tantalum, aluminum, and their alloys, e.g., metal carbides that include these elements, i.e., hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, two or more metal gate electrode layers may be deposited. For instance, a workfunction metal may be deposited followed by a metal gate electrode fill metal such as aluminum metal.

Accordingly, self-aligned epitaxial source and drain extensions have been disclosed that reduce the overall resistance of the MOS transistor and increase channel strain due to increased doped silicon volume (e.g., boron doped silicon germanium volume) combined with reduced silicon volume. The epitaxial source and drain extensions do not have a bulleted profile, form an abrupt boundary between the channel region and the source and drain regions, and have a doping concentration that is more easily controlled, yielding a more optimized source-drain profile. Furthermore, by selecting an appropriate combination of a dopant and an etchant recipe, implementations of the invention enable the source and drain extensions to be etched without being substantially impacted by the spacer thickness. This self-aligned process therefore increases performance while minimizing process variation.

Figure 4:
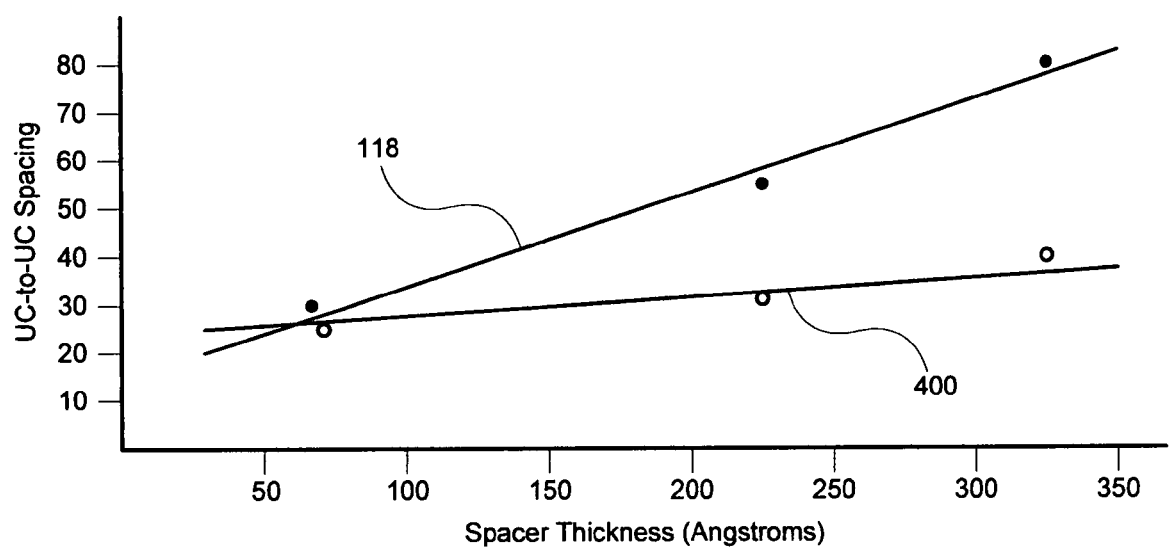
FIG. 4 is a graph illustrating how the UC-to-UC distance of a MOS device formed in accordance with an implementation of the invention is less dependent on spacer thickness.

FIG. 4 is a graph illustrating the improvement made available by the self-aligned methods disclosed herein. Line 400 represents data collected for MOS devices built using implementations of the invention. As shown, the UC-to-UC distance is much less impacted by spacer thickness than devices formed using conventional processes, the data for which is again represented by line 118.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. A transistor comprising:
    a gate stack formed on a substrate;
    spacers formed on laterally opposite sides of the gate stack;
    a source region and a drain region formed in the substrate adjacent and subjacent to the spacers, wherein:
        the source region includes a self-aligned source extension in close proximity to the gate stack of the transistor, wherein an interface between the source region and the substrate follows the <111> and <001> crystallographic planes, and
        the drain region includes a self-aligned drain extension in close proximity to the gate stack of the transistor, wherein an interface between the drain region and the substrate follows the <111> and <001> crystallographic planes.

2. The transistor of claim 1, wherein the gate stack comprises a high-k gate dielectric layer and a metal gate electrode.

3. The transistor of claim 1, wherein the source region and the drain region comprise carbon doped silicon.

4. The transistor of claim 1, wherein the source region and the drain region comprise boron doped silicon germanium.

5. The transistor of claim 2, wherein the source extension overlaps the high-k gate dielectric layer by more than 10 nm from and the drain extension overlaps the high-k gate dielectric layer by more than 10 nm.

6. The transistor of claim 1, wherein the source and drain extensions are epitaxially deposited.

7. The transistor of claim 1, wherein the source and drain extensions are formed by doping portions the substrate, etching the doped portions, and epitaxially depositing a silicon containing material in the etched areas.

* * * * *